United States Patent [19]

Pearce et al.

[11] 4,074,417
[45] Feb. 21, 1978

[54] METHOD OF SEALING ELECTRICAL HOUSING

[75] Inventors: Godfrey R. Pearce; William J. Breeden; Francis R. See, all of Glasgow, Ky.

[73] Assignee: P. R. Mallory & Co. Inc., Indianapolis, Ind.

[21] Appl. No.: 673,495

[22] Filed: Apr. 5, 1976

Related U.S. Application Data

[63] Continuation of Ser. No. 504,367, Sept. 9, 1974, abandoned.

[51] Int. Cl.$^2$ ............................................. H05K 5/03
[52] U.S. Cl. ........................................ 29/570; 29/588; 174/52 S; 361/272; 361/433
[58] Field of Search ............. 174/52 S; 317/230, 260; 29/570, 25.42, 588; 361/272, 271, 433

[56] References Cited

U.S. PATENT DOCUMENTS

| | | | |
|---|---|---|---|
| 2,758,149 | 8/1956 | Brennan | 174/52 S |
| 2,758,259 | 8/1956 | Peck | 317/230 |
| 3,300,692 | 1/1967 | Booe | 174/52 S |
| 3,319,133 | 5/1967 | Sparrow et al. | 317/230 |
| 3,428,869 | 2/1969 | Gilbert | 174/52 S |
| 3,629,935 | 12/1971 | Carino | 29/570 |
| 3,697,824 | 10/1972 | Greskamp | 317/230 |
| 3,852,647 | 12/1974 | Ishii | 29/570 X |

FOREIGN PATENT DOCUMENTS

| | | | |
|---|---|---|---|
| 1,021,342 | 3/1966 | United Kingdom | 317/230 |

Primary Examiner—J. V. Truhe
Assistant Examiner—D. A. Tone
Attorney, Agent, or Firm—Hoffmann, Meyer & Coles

[57] ABSTRACT

An electrical device comprising an electrical body in a container with terminals extending through an open end of the container. The electrical body has receptacles at opposite ends thereof. A positioning means is located at an end of the container opposite the open end thereof and projects into a receptacle of the electrical body. An assembly, closing the open end of the container, includes a first layer adjacent the electrical body with a positioning means projecting into a receptacle of the electrical body.

A disc-like member has a positioning means extending therefrom. A recess (or recesses as the case may be) is formed in the disc-like member and provides a membrane adapted to be punctured by a substantially rigid member such as the terminal of the electrical body. Optionally, a vent may be formed in the disc-like member to provide a rupturable elevated pressure release means.

An assembly for closing the open end of the container includes a first layer formed by the disc-like member, a second layer of material curable or cured in situ sealingly contacting the first layer, and a third layer sealingly contacting the second layer.

A method of closing the open end of the container housing the electrical body.

5 Claims, 5 Drawing Figures

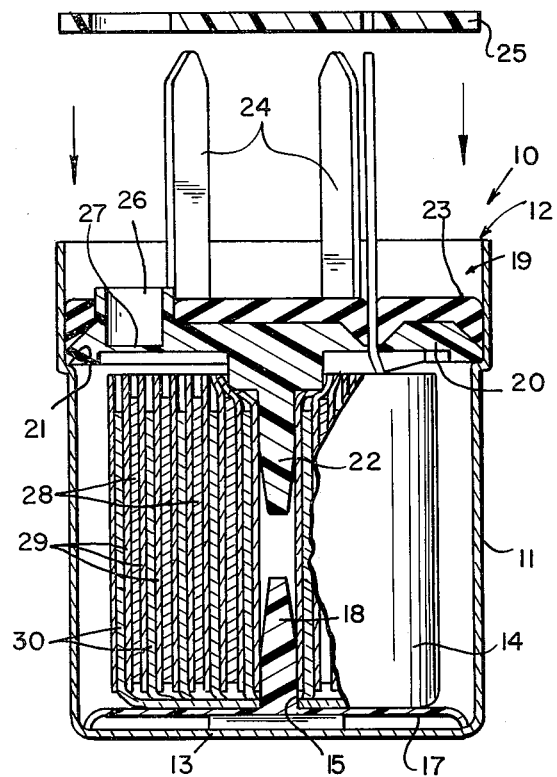
FIG. 1
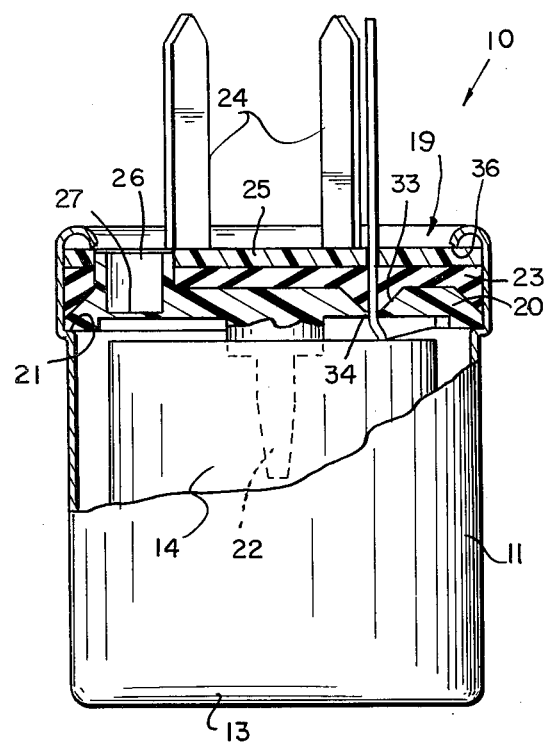
FIG. 2
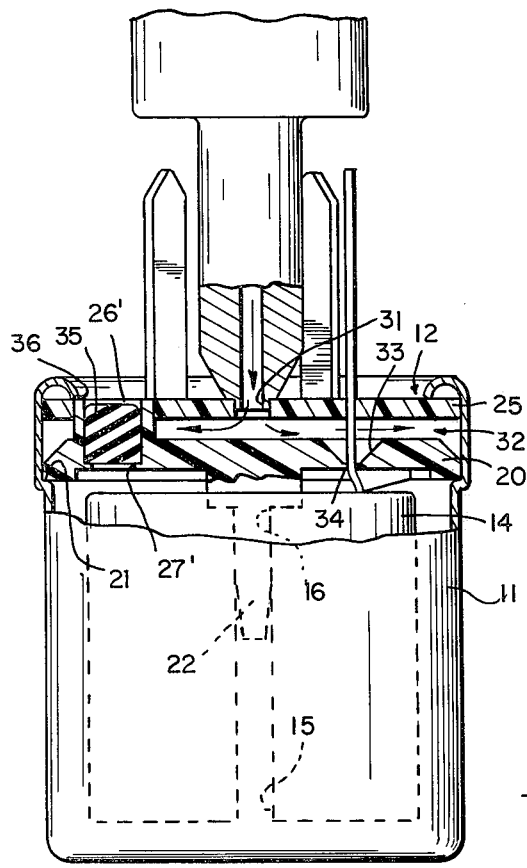
FIG. 3
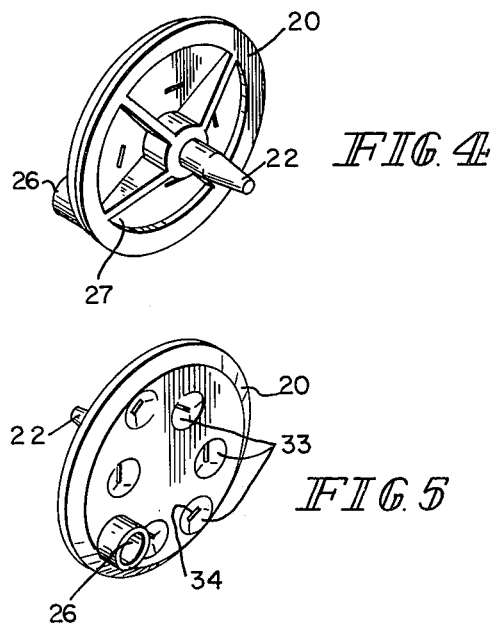
FIG. 4
FIG. 5

METHOD OF SEALING ELECTRICAL HOUSING

This is a continuation, of application Ser. No. 504,367, filed Sept. 9, 1974 now abandoned.

The present invention relates to an electrical device end to an assembly for closing an open end of a container employed in the device. More particularly, the present invention relates to a disc-like member including positioning means extending therefrom, a recess (or recesses as the case may be) in the member forming a puncturable membrane, and a rupturable vent in the disc-like member which forms an elevated pressure release means. The present invention also relates to an electrical device including an electrical body having a receptacle at opposite ends thereof and positioning means located at either end of the container projecting into a receptacle of the electrical body, and to a method of making the same. Further, the present invention relates to an assembly for closing the open end of the container including a first layer formed by the disc-like member, a second layer of material curable or cured in situ sealingly contacting the first layer, and a third layer sealingly contacting the second layer.

Prior electrical devices such as capacitors have employed end seals with poor life characteristics due to degradation of elastomeric materials used in the seal with the passage of time and exposure to elevated temperatures. A typical seal for a capacitor body consists of an inner rigid disc-like lamina, an outer rigid disc-like lamina, and a resilient material such as rubber positioned between the inner disc-like lamina and the outer disc-like lamina. Usually, the resilient material is subject to compressive restraint by a swaged or rolled-over edge portion of a container housing a capacitor body. The resilient material is deformed so as to compressively engage with the side wall of the container and the terminals of the capacitor projecting thru the seal. Such a seal structure is shown in U.S. Pat. No. 2,758,149.

The typical seal has significant problems associated with it. For example, aging harmfully effects the resilient characteristics of the material. Exposure of the resilient material to either elevated temperatures or to the chemical action of electrolytes associated with some electrical devices or both also harmfully effects the resilient characteristic of the resilient material. Furthermore, the lamina and resilient material of the seal may separate since no bond exists between the resilient material and either of the rigid lamina. The seal is the result of the compression of the resilient material between the rigid disc-like lamina during the closure of the container. Separation of lamina from the resilient material may result in the electrolyte leakage and in contaminants entering the area of separation. Either occurrence has a harmful effect on the operating characteristics of an electrical device.

One aspect of the invention relates to a curable or hardenable material occupying the area between disc-like layers and joined to such layers to provide an assembly for closing the open end of a container for an electrical device.

Prior electrical devices such as shown in U.S. patent 3,300,692 include an electrical body support in the closed end of the container. Although suitable for its intended purpose, an electrical body support or positioning means adjacent each end of the electrical body and projecting into receptacles at each end of the body provides several advantages including a more positive means of positioning, supporting and retaining the electrical body in and with respect to the container housing the body. Therefore, another aspect of the invention relates to positioning means adjacent each end of the electrical body and projecting into receptacles of the body.

Another aspect of the invention relates to a disc-like member having a positioning means extending therefrom, a recess (or recesses as the case may be) formed in the member and adapted to be punctured, and a rupturable vent formed in the member to provide an elevated pressure release means.

The present invention includes the feature of moving a curable or hardenable material into the area between the rigid disc-like members to occupy the area and contact the side walls of the container and the terminals projecting therefrom so as to close the container and form a second layer. Another feature of the present invention is to provide an electrical device comprising a container having an open end and an electrical body in the container with receptacles at opposite ends thereof, and positioning means adjacent each end of the electrical body having positioning means projecting into the receptacles of the electrical body. A further feature of the present invention is a rigid disc-like member having positioning means extending therefrom, a recess or recesses in the disc-like member providing a membrane adapted to be punctured by a substantially rigid member, and a rupturable vent located in the disc-like member forming an elevated pressure release means.

In the drawings:

FIG. 1 is a partial exploded cross sectional view of an electrical device embodying features of the present invention;

FIG. 2 is a partial cross sectional view of the electrical device shown in FIG. 1;

FIG. 3 shows a device for moving a cured or hardenable material between a third layer and a second layer of an assembly to occupy the area between such layers and contact the side walls and terminals of an electrical device to form a second layer and close the container;

FIG. 4 is a pictorial end view of a disc-like member used in the electrical device shown in FIG. 1; and FIG. 5 is yet another pictorial end view of the disc-like member of FIG. 4.

Referring now to FIG. 1 a partial cross sectional view of an electrical device 10 embodying features of the present invention is shown. A container 11 having an open end 12 and a closed end 13 is used to house an electrical body 14. The electrical body 14 includes a receptacle 15 located at one end thereof and a receptacle 16 located at the other end thereof. A positioning means 17 is located at the closed end 13 of the container 11. The positioning means 17 includes projection 18 projecting into the receptacle 15 of electrical body 14 as shown in FIG. 1. An assembly 19 is used to close the open end 12 of the container 11.

The assembly 19 includes layer 20 positioned adjacent to and restrained from further movement toward electrical body 14 by shoulder 21 formed in the side wall of container 11 as shown in FIG. 1. Layer 20 includes positioning means 22 projecting into the receptacle 16 of the electrical body 14 as shown in FIG. 1. The assembly 19 also includes a second layer 23 of a material curable or cured in situ over the layer 20 and contacting the side walls of the open end of the container 11 and contacting terminals 24 extending from the electrical body 14. A third layer 25, positioned above the container 11 in FIG. 1, is over the second layer 23. The assembly 19 further includes a rupturable vent 26. The vent 26 includes a thin membrane 27 which ruptures when exposed to an elevated pressure, if any, created within the container 11 during operation of the electrical device 10. Alternatively, the membrane 27 may include a suitable filler material which may be used to conduct evolved gas from the interior of container 11 thru the membrane area 27 to the surrounding atmosphere without rupturing the membrane 27. Some plastics such as polypropylene have a gas transmission rate associated therewith.

The electrical body 14 of the electrical device 10 may be any one of several electrical component bodies such as a capacitor or a battery. The concepts of the present invention have particular applicability to an electrical device 10 requiring the presence of a liquid electrolyte material.

The electrical device shown in FIG. 1 is an electrolytic capacitor. The body 14 of the electrolytic capacitor includes an etched metal containing anode electrode 28 such as aluminum or tantalum foil having a thickness of about 0.0008 to about 0.004 of an inch. The anode electrode foil 28 may or may not have a dielectric oxide film (not shown) formed over its surface. The cathode electrode 29 is an etched metal containing foil such as aluminum or tantalum having a thickness of about 0.0008 to about 0.004 of an inch which includes a dielectric oxide film (not shown) formed over its surface. A layer or layers of paper 30 such as Kraft paper are between adjacent anode and cathode electrode foils 28 and 29. The anode and cathode electrode foils 28 and 29, separated by the interleaved paper 30, are convolutely wound into a relatively tight roll to form the electrical body 14. The paper 30 of the convolutely wound electrical body 14 is impregnated, either before or after rolling, with a suitable electrolyte (not shown) such as a solution of ammonium borate and boric acid, plus glycol to help lower the freezing point temperature of the solution. The impregnated convolutely wound electrical body 14 is then inserted into the cavity of a substantially rigid container 11 made of any suitable metal such as aluminum or the like. The container 11 helps to provide physical protection for the convolutely wound electrical body 14, and, just as importantly, to minimize contamination of the wound electrical body by contact with moisture and the like which may, during operation of the capacitor, have a harmful effect on the electrical characteristics of the liquid type electrolytic capacitor. Ideally, the container 11 for the electrical body 14 has its open end sealed in an atmosphere which is relatively free from harmful contaminants.

Positioning means 17, made from any suitable plastic material resistant to most electrolytes and possessing good electrical insulating properties such as polypropylene and the like, includes elongated projection 18 projecting into the receptacle 15 of the electrical body 14.

The layer 20 and elongated positioning means 22 of the assembly 19 are formed from any suitable rigid plastic material resistant to most electrolytes and possessing good electrical insulating properties such as polypropylene and the like. The layer 23 of the assembly 19 is any suitable material curable or hardenable in situ which has good adherence to a variety of surfaces and has good electrical insulating properties such as silicone, polyester, wax, asphalt and the like. The layer 25 in any suitable rigid plastic material having good mechanical strength and good electrical insulating properties such as phenolic and the like.

FIG. 2 is a partial cross sectional view of the electrical device 10 shown in FIG. 1 with the exception that the layer 25 is illustrated as contacting the layer 23 of cured or curable material. After the layer 25 is moved into position, the rim of the open end 12 is rolled over or crimped to provide an edge portion as shown in FIGS. 1 and 2 which restricts movement of the layer 25 away from the body 14. Ideally, the layer 25 is joined to the layer 23.

FIG. 3 shows a method of closing the open end 12 of the container 11. An electrical body 14 is placed in the cavity of the container 11 thru the open end 12. The electrical body 14 has receptacles 15 and 16 located at opposite ends thereof. A layer 20 is placed adjacent the open end 12 and located on shoulder 21 of the container 11 so that positioning means 22 of layer 20 projects into receptacle 16 of the body 14. A "to be" third layer 25 is positioned adjacent the open end 12 of the container 11 and adjacent layer 20. Note that the radius of the layer 20 and the layer 25 are slightly less than the diameter of the open end 12 of the container 11 to facilitate insertion of each of the layers into the container. Extremity 36 at the open end 12 of the container 11 is made dimensionally smaller than the radius of the "to be" third layer 25 by any suitable method such as by crimping and the like to restrict outward displacement of the layer 25 from the container 11. A curable or hardenable material 23 is moved between the layer 20 and the layer 25 through aperture 31 to occupy the area 32 between layers 20 and 25 and contact the side walls of the container 11. It is seen that as material 23 is injected into the area 32, the layers 20 and 25 tend to be displaced in opposite directions with respect to each other. The crimp 36 at the opening 12 tends to restrict outward movement of layer 25 from the container 11, and shoulder 21 of the container tends to restrict inward movement of layer 20 with respect to the container 11. With layers 20 and 24 restricted from further movement with respect to each other and to the container 11, material 23 flows to area 32 and fills the area including intersticies to complete seal assembly 19 for the open end 12 of container 11. The material, similar to that of material 23 in FIGS. 1 and 2, may be moved into the area 32 by any convenient means such as by injection, pouring and the like.

The shoulder 21 retains the seal assembly 19 in spaced relationship with respect to the adjacent end of the electrical body 14. The gap formed between the inner face of the seal assembly 19 and the adjacent end of the electrical body 14, as shown in the several FIGURES of the drawing, provides some expansion space for gas, if any, evolved during operation of the electrical body 14 and for electrolyte leaked, if any, from the electrical body 14.

A modification of the vent 26 is illustrated in FIG. 3 with the vent 26' being provided by placing a resilient bung 35 in the opening 27'.

FIGS. 4 and 5 show a disc-like member 20 used to provide the first layer 25 shown in FIGS. 1, 2 and 3 of the drawing. The disc-like member 20 includes positioning means 22 projecting therefrom. A plurality of recesses 33 each include a puncturable membrane 34 adapted to be punctured by a member such as terminals 24. The disc-like member 20 includes vent 27 forming an elevated pressure release means.

The term "seal" as used herein means and includes an assembly used to substantially prevent escape of quantities of electrolyte from the interior of the container thru the open end of container which may have a harmful effect on the electrical characteristics of the device. Loss of significant quantities of electrolyte from the electrical body 14 has a harmful effect on the operating characteristics of such body.

We claim:

1. A method of making an electrical device comprising the steps of providing a container having an open end, placing in the container an electrical body having receptacles at each end thereof, positioning a disc-like member having a positioning means adjacent to the electrical body and the open end of the container to thereby project the positioning means into the receptacle of the electrical body, positioning a rigid member adjacent to the disc-like member, making the extremity at the open end of the container dimensionally smaller than the dimension of the rigid member, and moving a curable material between the disc-like member and the rigid member to occupy a volume between the members and contact side walls of the container and thereby close the container.

2. The method of claim 1 wherein during the step of moving the curable material between the members so as to occupy a volume, the rigid member is displaced into contact with the extremity at the open end of the container.

3. The method of claim 1 wherein the step of making the extremity at the open end of the container dimensionally smaller than the dimension of the rigid member is accomplished by crimping the extremity.

4. The method of claim 3 wherein the curable material is moved by injecting the curable material.

5. The method of clam 1 further including the step of curing the layer of curable material.

* * * * *